(12) United States Patent
Kawamoto

(10) Patent No.: US 7,543,104 B2
(45) Date of Patent: Jun. 2, 2009

(54) NON-VOLATILE SEMICONDUCTOR DEVICE FOR USE IN MEMORY CARD AND MEMORY SYSTEM

(75) Inventor: Kazuya Kawamoto, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 363 days.

(21) Appl. No.: 11/402,977

(22) Filed: Apr. 13, 2006

(65) Prior Publication Data

US 2006/0239089 A1  Oct. 26, 2006

(30) Foreign Application Priority Data

Apr. 15, 2005  (JP)  ............................. 2005-118592

(51) Int. Cl.
*G06F 13/10* (2006.01)

(52) U.S. Cl. ........................................ 711/103; 711/154

(58) Field of Classification Search .................. None
See application file for complete search history.

(56) References Cited

U.S. PATENT DOCUMENTS 6,826,081 B2 * 11/2004 Nagashima et al. .... 365/185.09

FOREIGN PATENT DOCUMENTS

JP       2003-58431       2/2003

* cited by examiner

*Primary Examiner*—Hyung S Sough
*Assistant Examiner*—Ngoc V Dinh
(74) *Attorney, Agent, or Firm*—Oblon, Spivak, McClelland, Maier & Neustadt, P.C.

(57) ABSTRACT

A semiconductor memory device includes a block and a reading portion. In the block, a plurality of memory cells are arranged in rows and in columns, and the block includes blocks including a plurality of pages. Each page is configured by a plurality of memory cells which are arranged in rows. The reading portion reads data of said plurality of pages in the block as a logical product for each column direction.

16 Claims, 11 Drawing Sheets

| Block 0 | Page 0 | Data region (DR) (512 bytes) | Redundancy region (RDR) (16 bytes) |
|---|---|---|---|
| | Page 1 | | |
| | ⋮ | | |
| | Page 31 | | |
| Block 1 | Page 0 | | |
| | Page 1 | | |
| | ⋮ | | |
| | Page31 | | |
| ⋮ | ⋮ | ⋮ | ⋮ |
| Block 1023 | Page 0 | | |
| | Page 1 | | |
| | ⋮ | | |
| | Page31 | | |

Columns: 0 ... 511  512 ... 527

| Byte | All pages | |
|---|---|---|
| 0~255 | Data region | DR |
| 256~511 | Data region | |

| Byte | All pages | |
|---|---|---|
| 512 | Reserved region | |
| 513 | | |
| 514 | | |
| 515 | | |
| 516 | Data status flag | |
| 517 | Block status flag | |
| 518 | Block address region 1 | RDR |
| 519 | | |
| 520 | ECC region 1 | |
| 521 | | |
| 522 | | |
| 523 | Block address region 2 | |
| 524 | | |
| 525 | ECC region 2 | |
| 526 | | |
| 527 | | |

|   |              |
|---|--------------|
| 0 | LBA0         |
| 1 | Erasure block|
| 2 | LBA1         |
| 3 | LBA2         |

10

⇒

|   |           |
|---|-----------|
| 0 | LBA0      |
| 1 | New LBA1  |
| 2 | Old LBA1  |
| 3 | LBA2      |

10

⇒

|   |              |
|---|--------------|
| 0 | LBA0         |
| 1 | LBA1         |
| 2 | Erasure block|
| 3 | LBA2         |

TBL

| Logical block | Physical block |
|---------------|----------------|
| 0             | 0              |
| 1             | 2              |
| 2             | 3              |

⇒

TBL

| Logical block | Physical block |
|---------------|----------------|
| 0             | 0              |
| 1             | 1              |
| 2             | 3              |

FIG. 9B

| Physical block 2 | 0  | Old data | LBA1 |
|                  | 1  | Old data | LBA1 |
|                  | 2  | Old data | LBA1 |
|                  | ⋮  | ⋮        | ⋮    |
|                  | 30 | Old data | LBA1 |
|                  | 31 | Old data | LBA1 |

| Physical block 1 | 0  | New data | LBA1 |
|                  | 1  | New data | LBA1 |
|                  | 2  | All "FF" |      |
|                  | ⋮  | ⋮        | ⋮    |
|                  | 30 | All "FF" |      |
|                  | 31 | All "FF" |      |

} Defective data

FIG. 10

| | | Data region (DR) | Redundancy region (RDR) | | | | | | |
|---|---|---|---|---|---|---|---|---|---|
| Physical block 1 | 0 | Old data | LBA1 | 0 | 1 | 1 | | 1 | 1 |
| | 1 | Old data | LBA1 | 1 | 0 | 1 | | 1 | 1 |
| | 2 | Old data | LBA1 | 1 | 1 | 0 | | 1 | 1 |
| | ⋮ | ⋮ | ⋮ | | | | | | |
| | 30 | Old data | LBA1 | 1 | 1 | 1 | | 0 | 1 |
| | 31 | Old data | LBA1 | 1 | 1 | 1 | | 1 | 0 |

FLG

FIG. 11 A

| | | Data region | Redundancy region | | | | | | |
|---|---|---|---|---|---|---|---|---|---|
| Physical block 2 | 0 | New data | LBA1 | 0 | 1 | 1 | | 1 | 1 |
| | 1 | New data | LBA1 | 1 | 0 | 1 | | 1 | 1 |
| | 2 | All "1" | | 1 | 1 | 1 | | 1 | 1 |
| | ⋮ | ⋮ | ⋮ | | | | | | |
| | 30 | All "1" | | 1 | 1 | 1 | | 1 | 1 |
| | 31 | All "1" | | 1 | 1 | 1 | | 1 | 1 |

FLG

FIG. 11 B

| | | | | | | | | | |
|---|---|---|---|---|---|---|---|---|---|
| Physical block n | 0 | New data | LBA1 | 0 | 1 | 1 | | 1 | 1 |
| | 1 | New data | LBA1 | 1 | 0 | 1 | | 1 | 1 |
| | 2 | Old data | LBA1 | 1 | 1 | 0 | | 1 | 1 |
| | ⋮ | ⋮ | ⋮ | | | | | | |
| | 30 | Old data | LBA1 | 1 | 1 | 1 | | 0 | 1 |
| | 31 | Old data | LBA1 | 1 | 1 | 1 | | 1 | 0 |

FIG. 12

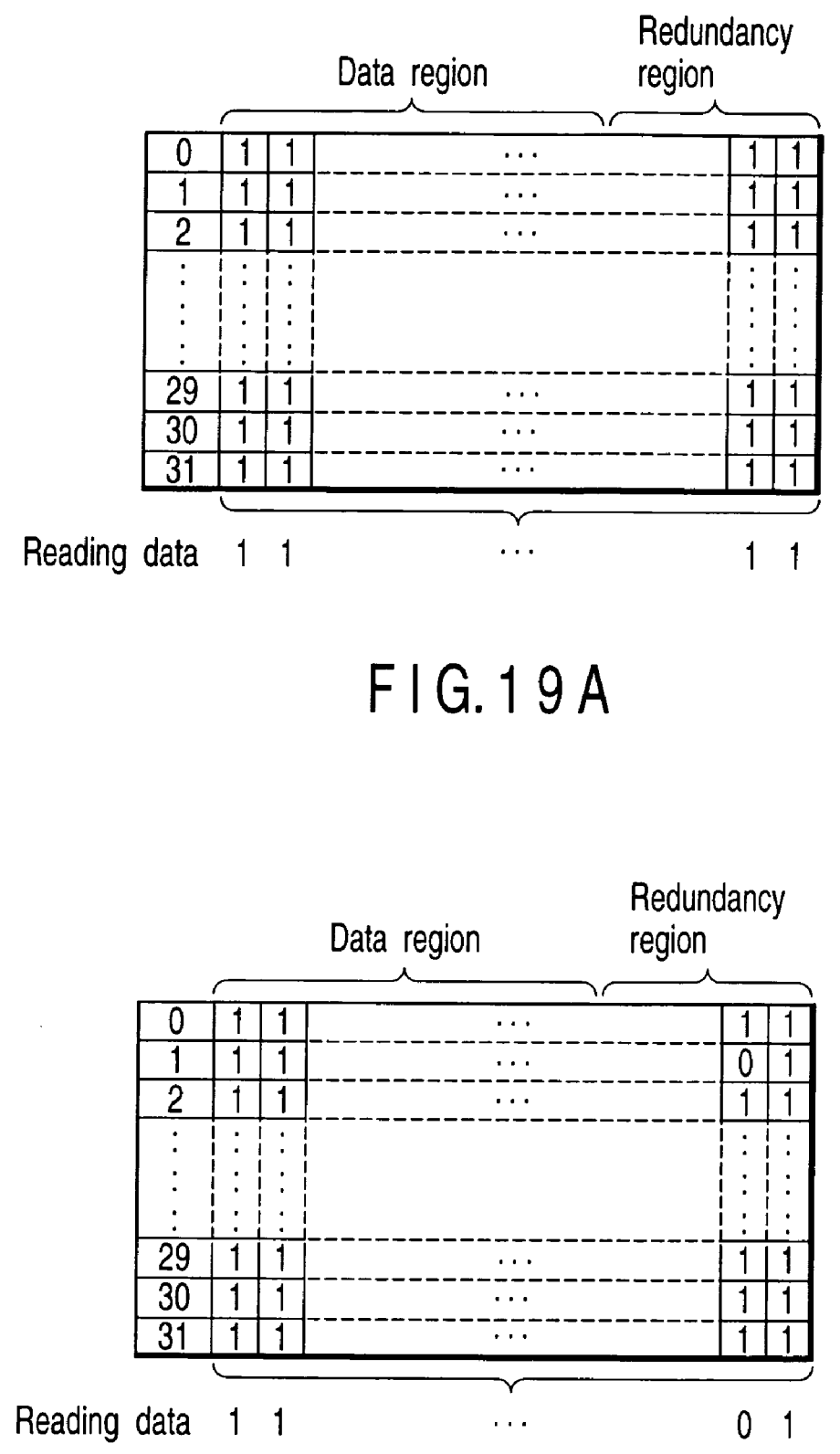

Data region / Redundancy region

| 0 | 1 | 1 | ... | 1 | 1 |
| 1 | 1 | 1 | ... | 1 | 1 |
| 2 | 1 | 1 | ... | 1 | 1 |
| : | : | : | | : | : |
| 29 | 1 | 1 | ... | 1 | 1 |
| 30 | 1 | 1 | ... | 1 | 1 |
| 31 | 1 | 1 | ... | 1 | 1 |

Reading data  1  1  ...  1  1

FIG. 19A

Data region / Redundancy region

| 0 | 1 | 1 | ... | 1 | 1 |
| 1 | 1 | 1 | ... | 0 | 1 |
| 2 | 1 | 1 | ... | 1 | 1 |
| : | : | : | | : | : |
| 29 | 1 | 1 | ... | 1 | 1 |
| 30 | 1 | 1 | ... | 1 | 1 |
| 31 | 1 | 1 | ... | 1 | 1 |

Reading data  1  1  ...  0  1

FIG. 19B

NON-VOLATILE SEMICONDUCTOR DEVICE FOR USE IN MEMORY CARD AND MEMORY SYSTEM

CROSS-REFERENCE TO RELATED APPLICATIONS

This application is based upon and claims the benefit of priority from prior Japanese Patent Application No. 2005-118592, filed Apr. 15, 2005, the entire contents of which are incorporated herein by reference.

BACKGROUND OF THE INVENTION

1. Field of the Invention

The present invention relates to a non-volatile semiconductor memory device to be used as, for example, a memory medium for a digital camera and a mobile information apparatus, and to a memory system.

2. Description of the Related Art

A memory card is used as a memory medium for a digital still camera and a mobile information apparatus. This memory card is configured such that a very small recess is provided in a thin plastic package and a non-volatile semiconductor device which comprises a flash memory using an EEPROM is embedded in the recess. The memory card is electrically connected to a host system via, for example, a dedicated connector to perform an input and an output of data between the memory card and the host system.

For example, a non-volatile semiconductor memory of 128M bits is divided into 1024 physical memory blocks. The block is a minimum unit at the time of erasing data. Data in memory cells are erased in block units. One block is further divided into 32 physical pages. One page constitutes a data writing and reading unit. One page is configured by 528 bytes, and 512 bytes out of 528 bytes constitute a user data region while the remaining 16 bytes are used as a redundancy region for storing error codes, management information and the like.

The redundancy region has a block status flag. With respect to the block status flag, 32 bits are provided for one block in the case where one block is configured by 32 pages. That is, the block status flag of 1 bit is arranged on each page. Depending on the data of the block status flag, it is determined whether the corresponding block is a normal block or a defective block. With respect to the normal block, "FFh" (symbol "h" denotes a hexadecimal) is written in the block status flag. In the case where the block is determined to be defective before shipment, "00h" is written in the block status flag. In the case where a defective state is generated during the user uses the non-volatile semiconductor memory after shipment, "F0h" is written in the block status flag. In the case where data "0" is written in two bits or more of the block status flag, the corresponding block is determined to be defective.

As a technique for saving such a defective state of the memory region, there has been developed a technique for replacing the defective region for each sector instead of the saving of each block (refer to, for example, Jpn. Pat. Appln. KOKAI Publication No. 2003-58431).

Meanwhile, in the non-volatile semiconductor memory for managing the defective state for each block, only data of the block status flag in the first page of each block is generally referred to in order to improve the detection efficiency of the defective blocks. That is, in the case where data of the status flags in all the pages in the block are read, it takes a long time to detect a defective block, and thus, the following method is adopted. As a consequence, in the case where a defective block is detected before shipment, data "00h" is written in the block status flag in each page of the block, and in particular, the data "0" must be certainly written in on the first page. Therefore, the memory in which the data item "0" cannot be written in the first page of the block does not enable identification of the defective block, so that the memory cannot be shipped out, which causes a decrease in the yield.

On the other hand, in the case where a defective block occurs at the time of usage by the user after the shipment, the data "F0h" is written in the block status flag in each page of the block. However, in the case where at least two or more bits of data cannot be written in the first page of the block, the data cannot be treated as a defective block. For this reason, there is a possibility that the defective block is treated as a normal block again, and there arises a situation in which a normal memory control is not performed.

Further, there is a problem in that in the case where a defective block is present, it is required to perform the reading operation a plurality of times in order to determine the presence of the defective block, so that it takes a long time to detect the defective block and the system performance thereof is deteriorated.

Furthermore, at the time of updating data stored in the memory card, it is necessary to detect the state of the block, but it takes a long time to detect the state of the conventional blocks.

Therefore, there is demand for a non-volatile semiconductor memory device and a memory system, the device being capable of securely detecting a block state of a defective block or the like at a high speed, and being capable of suppressing a deterioration of the system performance.

BRIEF SUMMARY OF THE INVENTION

According to a first aspect of the invention, there is provided a semiconductor memory device comprising: a block having a plurality of memory cells arranged in rows and columns thereof, and including a plurality of pages, said plurality of pages are respectively arranged in rows; and a reading portion which reads data in said plurality of pages in the block as a logical product in each column direction.

According to a second aspect of the invention, there is provided a semiconductor memory device comprising: a block in which a plurality of first memory cells which store data and a plurality of second memory cells which store control data are arranged in rows and columns, the block having a plurality of word lines arranged in rows thereof and a plurality of bit lines arranged in the columns thereof; a first reading portion which reads data at least to one of said plurality of bit lines by selecting one of said plurality of word lines; and a second reading portion which reads a logical product of the data in said plurality of second memory cells which share each of the bit lines via each of the bit lines by simultaneously selecting said plurality of word lines at the time of determining a state of the block.

BRIEF DESCRIPTION OF THE SEVERAL VIEWS OF THE DRAWING

FIG. 9A is a view showing a procedure of data update of a block address region; and FIG. 9B is a view showing a table TBL formed in a host system;

FIG. 10 is a view showing a state of a physical block in the case where an access is interrupted during writing;

FIGS. 11A and 11B are views each showing a flag region according to a second embodiment;

FIG. 12 is a view showing a state in new data and old data which are written in the physical block are merged in accordance with a third embodiment;

FIGS. 19A and 19B are views showing erase verification according to a sixth embodiment.

DETAILED DESCRIPTION OF THE INVENTION

Hereinafter, embodiments of the present invention will be explained with reference to the drawings.

Figure 2:
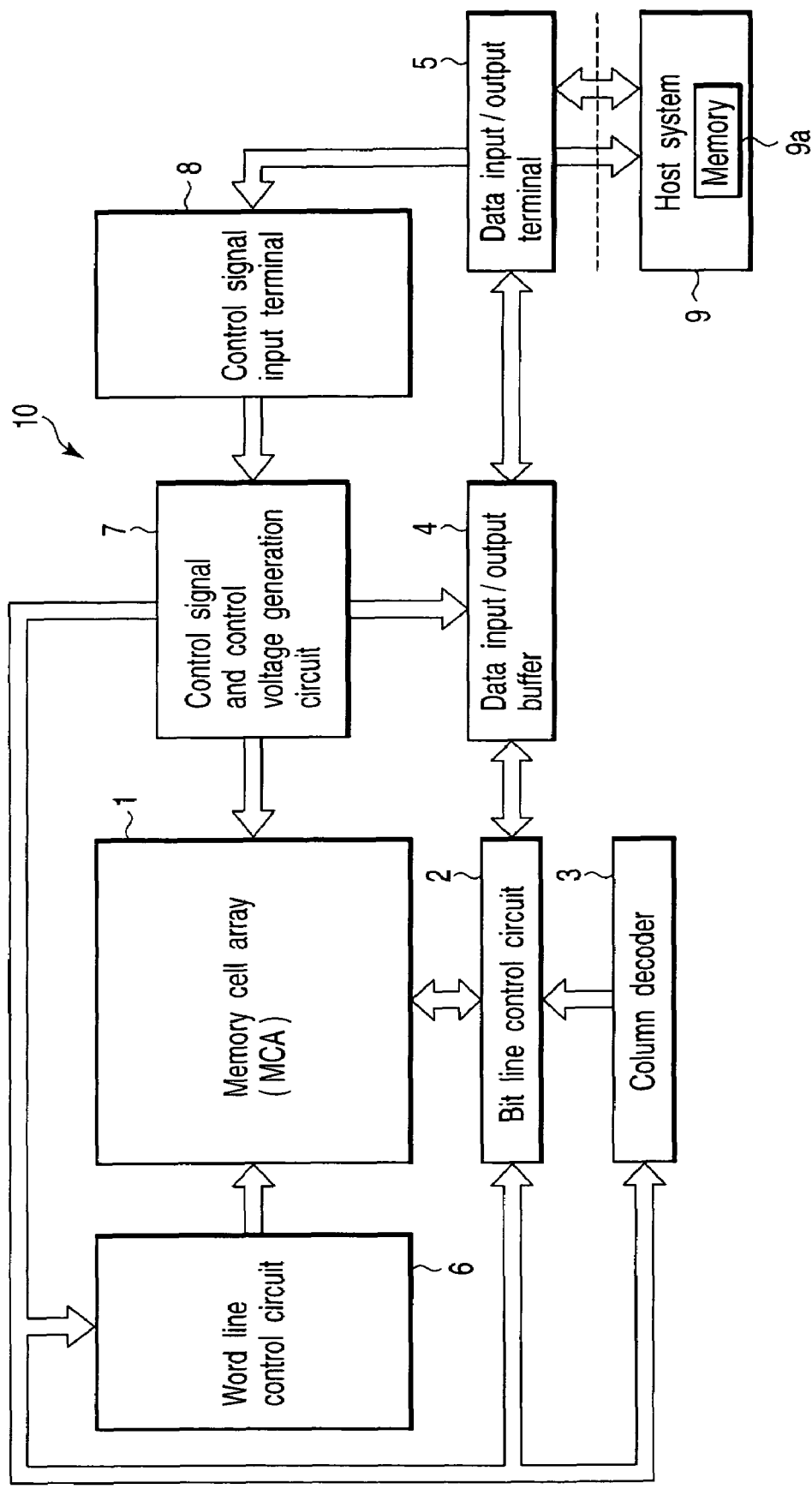
FIG. 2 is a configuration diagram showing a non-volatile semiconductor memory device to which the first embodiment is applied.

FIG. 2 shows a schematic configuration of a memory card using a non-volatile semiconductor memory device, for example, an NAND type flash memory to which a first embodiment is applied.

In a flash memory 10, a memory cell array 1 includes a plurality of bit lines, a plurality of word lines, and a common source line. For example, electrically data rewritable memory cells comprising, for example, EEPROM cells are arranged in rows and in columns in a matrix form. A bit control circuit 2 for controlling bit lines and a word line control circuit 6 are connected to the memory cell array 1.

The bit line control circuit 2 includes a plurality of sense amplifiers connected to the bit lines as described below. The bit line control circuit 2 serves to read data of memory cells in the memory cell array 1 via the bit lines, detect the state of the memory cells in the memory cell array 1 via the bit lines, and apply a writing control voltage to the memory cells in the memory cell array 1 via the bit lines to write data in the memory cells. A column decoder 3 and a data input/output buffer 4 are connected to the bit line control circuit 2. A sense amplifier in the bit line control circuit 2 is selected by the column decoder 3. Data which has been read to the sense amplifier is output from a data input/output terminal 5 to an external host system 9 via the data input/output buffer 4.

Further, the writing data input from the outside to the data input/output terminal 5 is input to the bit line control circuit 2 selected by the column decoder 3 via the data input/output buffer 4.

The word line control circuit 6 is connected to the memory cell array 1. The word line control circuit 6 selects a word line in the memory cell array 1, and applies a voltage required for reading, writing and erasing the data to the selected word line.

The memory cell array 1, the bit line control circuit 2, the column decoder 3, the data input/output buffer 4, and the word line control circuit 6 are connected to a control signal and control voltage generation circuit 7, and are controlled by the control signal and control voltage generation circuit 7. The control signal and control voltage generation circuit 7 is connected to a control signal input terminal 8 and is controlled by a control signal input from the external host system 9 via the control signal input terminal 8.

The bit line control circuit 2, the column decoder 3, the word line control circuit 6, the control signal and control voltage generation circuit 7 constitute a writing circuit and a reading circuit.

Figures 3, 4:
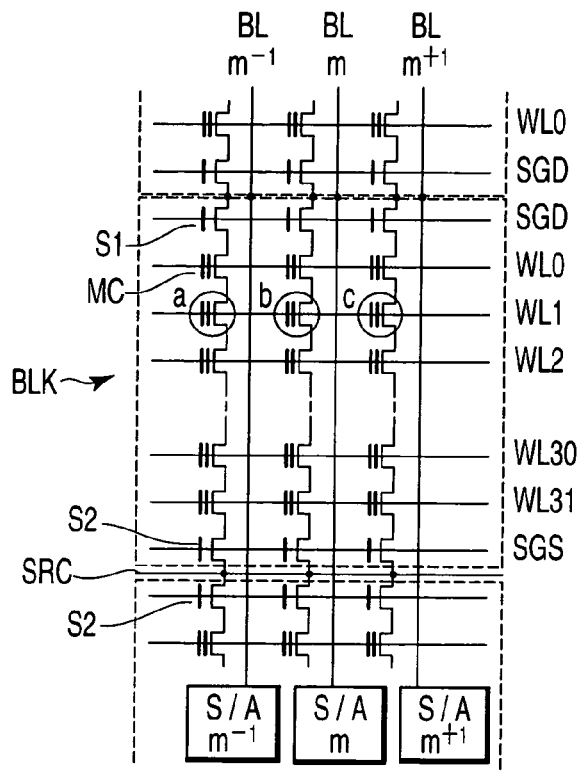
FIG. 3 is a circuit diagram showing a part of a memory cell array shown in FIG. 2.
FIG. 4 is a view showing a format of a NAND type flash memory.

FIG. 3 shows a part of the memory cell array 1 shown in FIG. 2 and a configuration of sense amplifiers in the bit line control circuit 2. A plurality of NAND strings are arranged on the memory cell array 1. One NAND string includes, for example, 16 memory cells MC connected in series, and first and second selection gates S1 and S2. The first selection gate S1 is connected to a bit line BLm−1 while the second selection gate S2 is connected to a source line SRC. Control gates of the memory cells arranged in respective rows are commonly connected to word lines WL0, WL1 and WL2 to WL31. Furthermore, the first selection gate S1 is commonly connected to a select line SGD while the second selection gate S2 is commonly connected to a select line SGS.

As shown by a broken line, the memory cell array 1 includes a plurality of blocks BLK. Each block is configured by a plurality of NAND strings, and data is erased in this block unit.

Further, data is written to and read from the memory cell in such a manner that one word line is selected in accordance with an external address for each page. Data read from the memory cells of one page are detected by a corresponding sense amplifier via each bit line.

FIG. 4 shows a format of, for example, a 128-Mbit NAND type flash memory using FIGS. 2 and 3. The non-volatile semiconductor memory device is divided into, for example, 1024 physical memory blocks. The block is a minimum unit at the time of the data erase described above. One block is divided into 32 physical pages. One page is a basic unit of the data writing and reading. One page is composed of 528 bytes, and 512 bytes out of 528 bytes constitute a data region which can be used by a user, and the remaining 16 bytes constitute a redundancy region. The redundancy region is used for storing error correcting codes, management information and the like.

Figures 5A, 5B, 6:
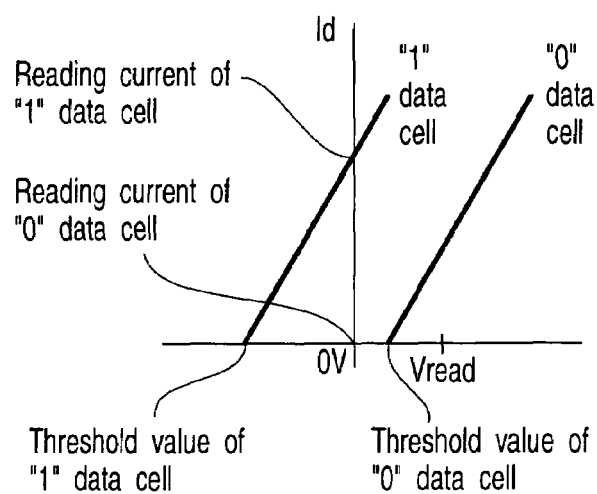
FIG. 5A is a view showing a configuration of a memory region.
FIG. 5B is a view showing an example of system management data to be written in a redundancy region.
FIG. 6 is a view showing a relation between data of a memory cell and a reading potential.

FIGS. 5A and 5B shows one example of a physical format of the flash memory shown in FIG. 4. FIG. 5A shows a configuration of a data region DR. FIG. 5B shows an example of management data of a system to be written in a redundancy region RDR.

In FIG. 5B, the redundancy region RDR is provided with the above-described block status flag. In the case where one block is configured by 32 pages with respect to the block status flag, 32 bits are provided for one block. That is, a 1-bit block status flag is arranged on each page. In this block status flag, data is written which shows as to whether the corresponding block is a normal block or a defective block. In the case of the normal block, "FFh" is written in the block status flag. It is defined that, in the case where data "0" of 2 or more bits is included in the data of the block status flag, the block is determined to be a defective block. Furthermore, in the case where it is determined that the block is a defective block before shipment, "00h" is written in the block status flag. In the case where the defective block is present later during usage by the user, "F0h" is written in a block status flag corresponding to the block, and is classified from the normal block. In the case where it is determined that, for example, the writing to or the erasing from a memory cell is not normally performed during usage by the user, it is recognized that a region including this memory cell is a defective block, and data notifying that the block is a defective block is stored in the block status flag. As a consequence, the data stored in the block in which the data showing the defective block has been written cannot be referred to.

The redundancy region has an ECC region 1 and an ECC region 2 for storing the error correcting codes, and is configured such that it is possible to determine whether or not data is normal at the time of reading the data by using the error correcting code. In the case where data cannot be corrected by using the error correcting code, a region including the data is recognized as a defective block, and a marking notifying that the region is a defective block is provided in the block status flag. For this reason, the data stored in this block cannot be referred to afterward.

Further, the redundancy region has a reserved region, a data status flag, and block address regions 1 and 2.

Next, there will be explained an operation of the first embodiment with reference to FIGS. 1, 3, 6 and 7.

FIG. 3 shows an operation at the time of normal reading. In the NAND type flash memory card, the data stored in the memory cell is read in a page unit. When an address is set, a selection potential Vread is applied to the select line SGD, so that the block is selected. Furthermore, 0 V is applied to the word line WL1 corresponding to the selected page in the block while the potential Vread is applied to the word lines WL0 and WL2 to WL31 corresponding to the non-selection pages. Here, the memory cells a, b and c connected to the word line WL1 are noted.

As apparent from FIG. 6, the memory cells a, b and c are set to an ON or OFF state depending on data "0" or "1" held by the memory cells with the potential 0 V applied to the word line WL1. The other memory cells are always set to an ON state with the potential Vread applied to the word lines WL0 and WL2 to WL3 irrespective of the held data. Consequently, "0" or "1" data held by the memory cells a, b and c selected by the word line WL1, namely, the ON or OFF state of the memory cells is supplied to sense amplifiers S/Am−1, S/Am and S/Am+1 via the bit lines BLm−1, BLm and BLm+1 to be detected. As a result, the read "1" or "0" data is established.

Next, an operation of detecting a defective block will be explained. A defective block is detected by batch reading of data in the memory cells in the block using a batch read function.

Figure 1:
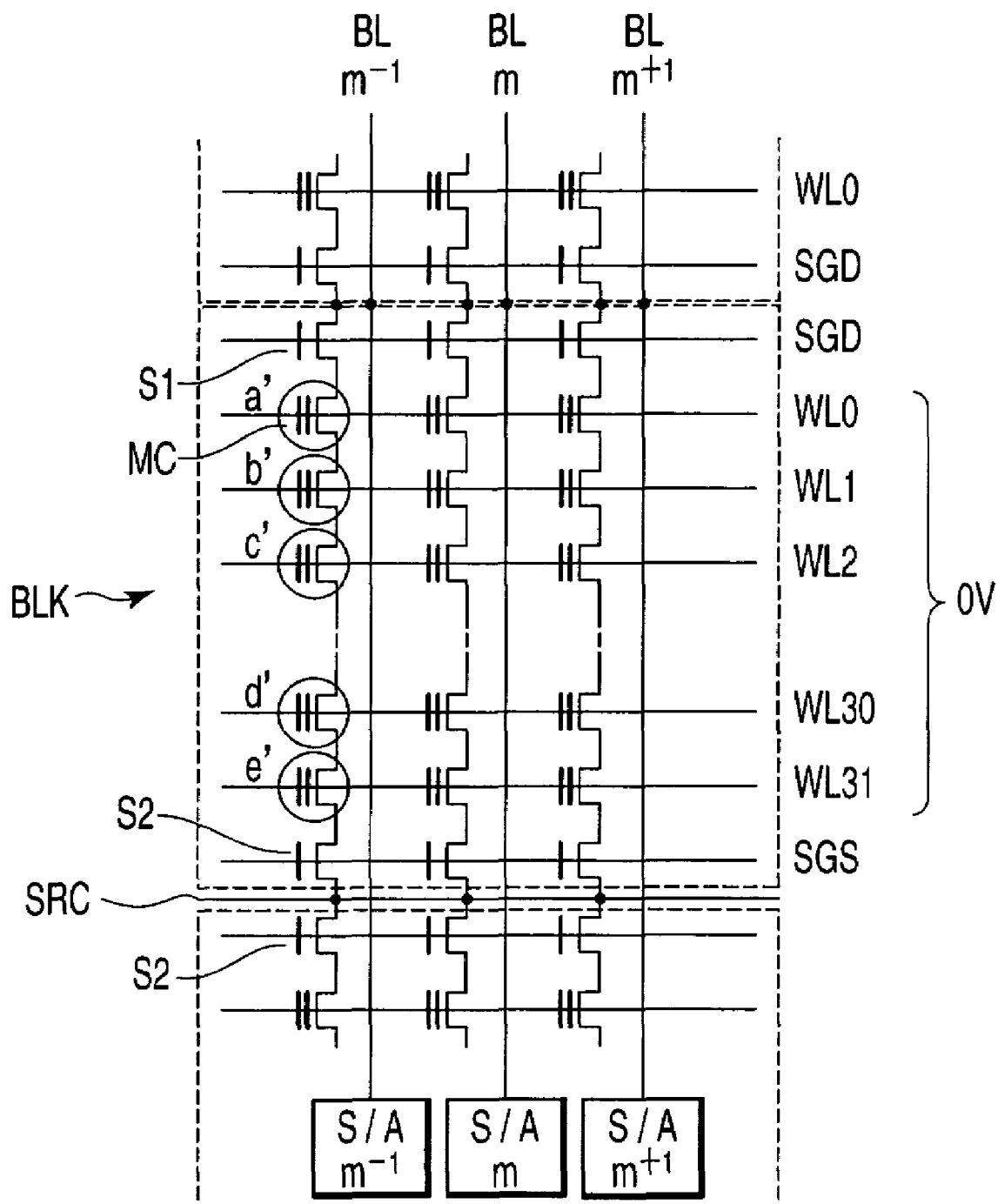
FIG. 1 is a circuit diagram showing an operation of a first embodiment.

FIG. 1 shows a potential at each component at the time of detection of defective blocks using the batch read function. In this case, all the pages in the selected block are selected. That is, a selection potential 0 V is applied to all the word lines WL0 to WL31. As a consequence, in the case where, for example, at least 1 or more memory cells out of memory cells a' to e' hold the data "0", the data detected by the sense amplifier S/Am−1 via the bit line BLm−1 becomes "0" irrespective of the data held in other memory cells.

In the case where all the memory cells a' to e' hold the data "1", on the other hand, the data detected by the sense amplifier S/Am−1 via the bit line BLm−1 becomes "1". That is, this reading operation detects data read from a plurality of memory cells constituting the NAND string as a logical product in the column direction. With this reading operation, the presence of the data "0" stored in any of the pages in the block can be detected at once in one time reading operation.

In this manner, data is read to each sense amplifier via each of the bit lines of the selected block. The read data is supplied to the host system 9. The host system 9 determines whether or not the block status flag in the redundancy region of the supplied data is either data "1" or data "0". As a consequence, it is possible to determine whether the selected block is normal or defective. That is, in the case where "FFh" has been stored in a block status flag, an output signal of a sense amplifier corresponding to the block status flag becomes "1" (normal). In the case where "00h" or "F0h" has been stored in a block status flag, an output signal of a sense amplifier corresponding to the block status flag becomes "0" (defective).

Figure 7:
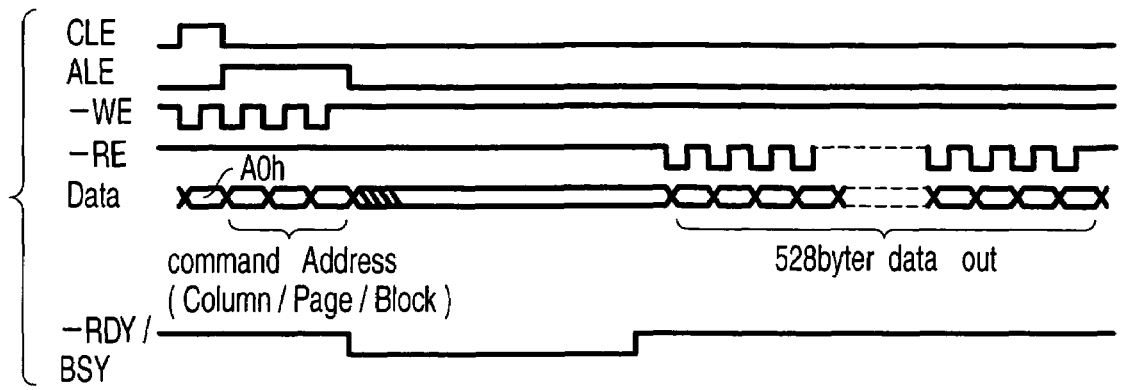
FIG. 7 is a timing chart showing an operation of FIG. 1.

In the operation of detecting the defective block, specifically, as shown in FIG. 7, a batch read command which is different from the normal reading command, for example, "A0h", a column address, a page address, and a block address are supplied to the non-volatile semiconductor memory device from the host system 9. That is, as shown in FIG. 2, the above batch read command is supplied from the host system 9 to the control signal and control voltage generation circuit 7 via the control signal input terminal 8. The control signal and control voltage generation circuit 7 generates a voltage for selecting all the word lines in the selected block in accordance with the batch read command, and a voltage for selecting all the bit lines. In this manner, the data of the logical product of the data read from the selected memory cell is output to each of the bit lines in the block.

According to the first embodiment, the data in all the pages of the selected block are read en bloc, and the logical products of the data in the plurality of memory cells which share the bit lines are detected by a sense amplifier to be output. Consequently, also in the case where data showing a defective block cannot be written in a block status flag in the first page of a block, it can be easily determined whether or not the block is defective by the operation of reading in a lump all the pages in the block if data showing a defective block can be written in at least one block status flag in the block. Therefore, in the case where a defective block is detected before shipment or after shipment, it is possible to identify a defective block only if data can be written in block status flags in other pages even when data cannot be written in the block status flag in the first page of the block.

Besides, the time required for reading in a lump data in all the pages of the selected block is the same as the conventional case in which data in the first page is read to detect defective blocks. Consequently, it is possible to securely detect defective blocks without causing a decrease in the performance.

Incidentally, in the above explanation, an explanation has been given to the case in which all the pages in the block are batch selected to read data. However, it is not necessary to read all the pages en bloc. Even when a plurality of pages, for example, two pages are simultaneously selected and detected, a large advantage can be obtained as compared with the conventional case in which only one page is selected.

Furthermore, there is in recent years a tendency of an increase in the capacity of the memory and decease in the cost thereof as a result of an enlargement of the block size of the NAND type flash memory. For this reason, in the case where defective memory cells are detected, a block including the defective memory cells is not determined to be a defective block. Instead, only a page including the defective memory cells is determined to be defective. There also arises a case in which defective pages are determined. In this case as well, the defective pages can be detected by applying the above first embodiment in a short time in the same manner as the detection of the defective blocks.

Figure 8:
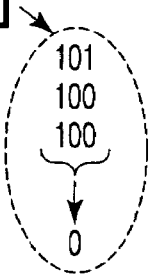
FIG. 8 is a view showing a modified example of the first embodiment.

FIG. 8 shows one example of the defective page detection. In the example shown in FIG. 8, there is shown a case in which the first page and the final page are defective pages. A redundancy region in each page has the same bit number as the number of pages in the block. The flag data "0" showing the defective page is written in a bit position corresponding to the page of the redundancy region. In this manner, the defective page can be specified from the bit position of the data "0" detected at the time of batch reading by writing the flag data in respective pages in difference columns.

Incidentally, the flag data item is not limited to 1 bit. As shown in a round arrow of FIG. 8, the flag data may be constituted of a plurality of bits. In the case where flag data is constituted of a plurality of bits, a value of the flag data is determined by a majority of the plurality of bits. In such a case, the reliability of the flag data can be improved. This configuration can be also applied to embodiments which will be described later.

Second Embodiment

Next, there will be explained a second embodiment. As has been described above, a physical format shown in FIGS. 5A and 5B is regulated in a NAND type flash memory, and data stored in the NAND type flash memory is managed in accordance with the format. Each page in the block holds data in accordance with the physical format shown in FIGS. 5A and 5B.

In the second embodiment, the block address region 1 and the block address region 2 shown in FIG. 5B are noted. In the block address region 1 and the block address region 2, the same data are stored. Resistance properties against bit errors of the data stored in the block address region 1 and the block address region 2 are heightened by storing parity bits respectively in EEC regions 1 and 2 arranged in correspondence to the block address region 1 and the block address region 2.

Furthermore, the data stored in the block address region 1 and the block address region 2 show a logical block address. In order to establish a correlation between the logical address and the physical address in the NAND type flash memory, the block address region 1 and the block address region 2 are prepared.

FIG. 9A shows a procedure of updating the data in the block address region. Here, there will be explained a case in which the physical block and the logical block correspond to each other on a one-to-one basis. In this example, there is shown a case in which the flash memory 10 is configured by four physical blocks. Suppose that, in the initial state, a logical block LBA0 is written in a physical block 0, a physic block 1 is set to an erase state, a logical block LBA1 is written in a physical block 2, and a logical block LBA2 is written in a physical block 3.

In the beginning, the host system 9 reads the first page of each physical block in accordance with the physical block shown in FIGS. 4 and 5B to obtain a logical address stored in the block address region. As shown in FIG. 2, the host system 9 forms a table TBL showing a correlation between the physical address and the logical address on a built-in memory 9a comprising, for example, a RAM.

FIG. 9B shows a table TBL formed in the host system 9. Here, in the case where the host system demands the update of the data of the logical block LBA1, the updated data of the logical block LBA1 is written in the physical block 1 in the erase state in the flash memory 10. Thereafter, the physical block 2 holding the data before updated is erased. In addition, the data on the table TBL in the host system 9 is also updated. That is, the logical block LBA1 is written in the physical block 1.

By means of the repetition of the above operation, a specific logical address is prevented from being allocated to a specific physical address, so that the writing is controlled so as not to be concentrated on the specific physical block.

Here, in the case where a power source of the host system 9 is unexpectedly interrupted during the update of the data, or the flash card is unexpectedly removed from the host system 9, the access to the flash memory is interrupted. For example, as shown in FIG. 9A, in the case where the access to the flash memory is interrupted owing the cause described above during the updated data of the logical block LBA1 is written in the physical block 1, the writing is suspended in an incomplete state.

FIG. 10 shows a sate of the physical blocks 1 and 2 in the case where the access to the flash memory is suspended during the data is written in the physical block 1. The physical block 1 is written in the halfway pages, so that the subsequent pages remain as incomplete data.

In the above state, the host system 9 is turned on again. By means of the above-described operation, the block address region of the flash memory is read to generate a table which shows a correlation between a logical block address and a physical block address on the memory of the host system 9. However, since the same logical address LBA1 is present in the physical block 1 and the physical block 2 in this example, the host system 9 must select either of the two physical blocks. Consequently, the processing is generally performed through the following procedure. First, as has been described above, the first page of each of the physical blocks is read. In the case where a plurality of physical blocks having the same logical block address is detected, the final pages of the blocks are also read. Here, it is determined that an unusual state occurs and the work is suspended during the update of data with respect to a physical block in which no data is stored in the final page thereof. Then, the data in this physical block are erased. Through this processing, the logical block and the physical block are held in a relation on a one-to-one basis. Furthermore, in the case where data are stored up to the final page in both the two physical blocks, the data in either of the two physical blocks is erased at a certainty of ½.

In this manner, in the case where a plurality of physical blocks having the same logical block address are present, the correlation between the logical block and the physical block is established on a one-to-one basis through a plurality of times of reading operation as described above. Consequently, it takes a long time to establish the correlation between the logical block and the physical block, which leads to deterioration of the performance thereof.

Therefore, in the second embodiment, there is provided a flag region which shows up to which page in the block the data have been written to the redundancy region. The data written in the flag region is read as logical product data for each bit line in the same manner as in the first embodiment.

FIGS. 11A and 11B each shows a flag region. More specifically, a flag region FLG of one or more bits is provided on each page of each block. With respect to a page on which the writing is completed, data "0" is written as flag data to at least 1 bit of the flag region FLG. Since the flag data is not written in the same bit line. This flag data shows that the writing has been completed.

On the other hand, in the case where the writing is interrupted as described above, the data in the block are read out by using a batch read function in the same manner as in the first embodiment upon turning on the host system 9 again. That is, the host system 9 issues the batch read command. On each of the bit lines, logical product data of the data stored in the NAND string is read out. The read data is transferred to the host system 9. The host system 9 determines the data of the flag region FLG out of the supplied data. As shown in FIG. 11A, the data in the flag region FLG are all "0" in the case where writing of all the pages in the block is completed. However, in the case where the writing is incomplete as shown in FIG. 11B, the data in the flag region FLG are "001 . . . 1" and do not become all "0". As a consequence, it is possible to easily determine to which page of the physical block the writing is completed by one time reading operation.

According to the above second embodiment, the flag region FLG is provided in the redundancy region, all the data in the block are read en bloc as logical product data for each bit line to detect the data written in the flag region FLG, whereby it is possible to determine to which page in the block the data have been written. Consequently, even in the case where a plurality of same logical block addresses are present, it is possible to determine the block in the incomplete writing state through one time reading operation, so that a decrease in performance can be prevented.

Third Embodiment

A third embodiment is a modified example of the second embodiment. In the case where a plurality of physical blocks having the same logical block address are present in the second embodiment, the data in the physical block in which the writing is incomplete are erased. However, in order to attach importance to new data written in the physical blocks as much as possible, there is considered a system which adopts a control method by which data after updated and data before updated are merged to provide new data.

In a block for normally storing incomplete data, reading operation is required for example, at least "the number of pages which have been written plus once" times or "the number of pages on which data are not written plus once" times in order to determine to which page the data are stored.

However, in this case as well, it is possible to detect easily to which page in the block the data after updated are stored in the block including the incomplete data by using a batch read function of reading in a lump the data in the flag region FLG and in the block shown in the second embodiment. That is, in the case where the data are read from the block including the incomplete data shown in FIG. 11B, the read data become "001 . . . 1", and it is possible to determine easily to which page in the block the data after updated are stored. In this case, it is possible to know that the data are written to page 2 from the read data. As a consequence, as shown in FIG. 12, the data in page 0 and page 1 of the physical block shown in FIG. 11B and the data after page 2 of the physical block 2 shown in FIG. 11A can be easily merged.

According to the third embodiment, it is possible to easily detect in one time reading operation as to whether to which page the data after updated are stored in the block including incomplete data by utilizing the batch read function of reading en bloc the data in the flag region FLG and in the block. Therefore, the merging operation can be effectively performed.

Fourth Embodiment

In the second and third embodiments, there has been explained a case in which the physical block and the logical block correspond to each other on a one-to-one basis. In contrast to this, in a fourth embodiment, there will be explained a control method which allows the presence of one logical block in two or more blocks.

Figures 13, 14:
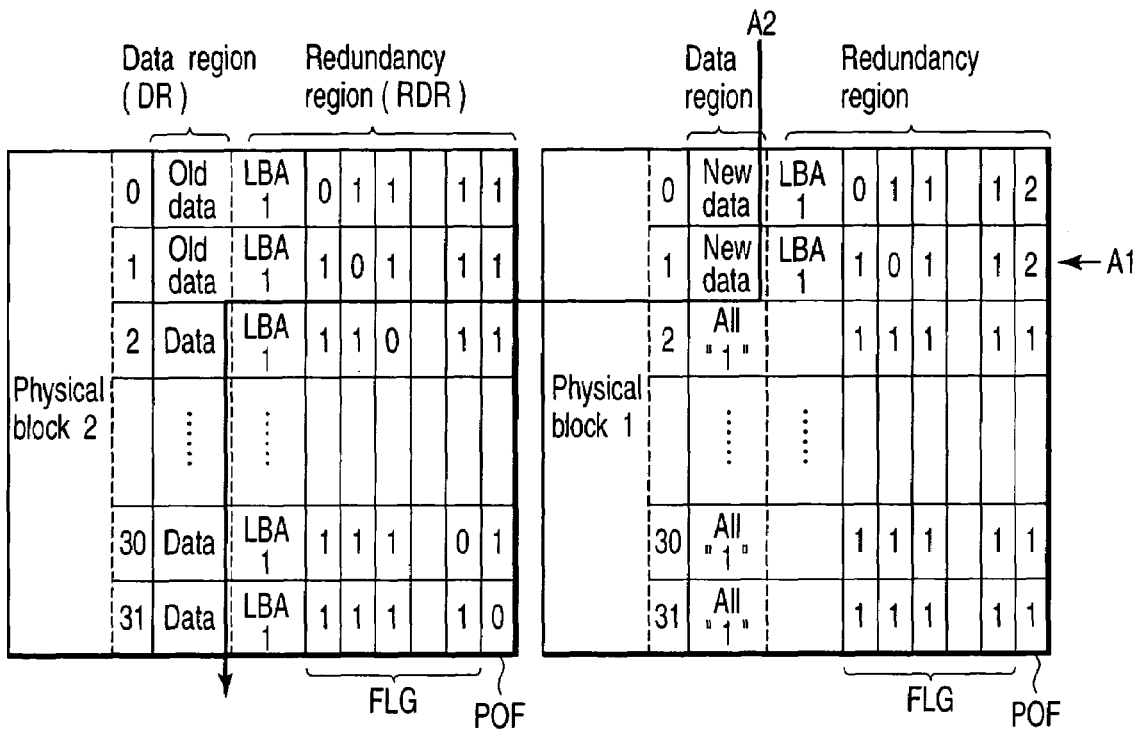
FIG. 13 is a view showing an access operation of two physical blocks having the same logical block address in accordance with a fourth embodiment.
FIG. 14 is a view showing an example of data management in which a plurality of logical blocks are stored in the same physical block.

FIG. 13 shows the fourth embodiment. There is shown a case in which physical blocks 2 and 1 having the same logical block address LBA1 are present. The physical blocks 1 and 2 respectively have a data region DR and a redundancy region RDR. Each redundancy region RDR has a logical block address, a plurality of flag data FLG, and a program order flag POF.

New data and old data written in the physical blocks 1 and 2 are determined from the writing state of a page in a block by the host system 9 which uses the flag data FLG or from a value of the program order flag POF. Like the physical block 2 shown in FIG. 13, a block in which data are written up to the final page in the block is classified as a programmed block whereas a block in which data are written in the halfway pages in the block is classified as a programming block like the physical block 1 shown in FIG. 13.

For example, in FIG. 13, in the case where the first page of the programmed block (the physical block 2) is updated in FIG. 13, new data is written in the first page of the programming block (the physical block 1).

In the case where the data in the logical block address LBA1 is read, as shown by A2 in FIG. 13, data on page 0 and page 1 of the programming block (the physical block 1) are first read followed by sequentially reading the data on page 2, page 3 page 31 of the programmed block (the physical block 2).

Next, for example, in the case where page 5 of the logical block address LBA1 is updated, data on page 3 and page 4 of the programmed block (the physical block 2) are copied to page 3 and page 4 of the programming block (the physical block 1) whereas the data on the new page 5 is stored in page 5 of the programming block (the physical block 1). The reading operation first reads the physical block 1 up to page 5 in the same manner as described above followed by reading data after page 6 of the physical block 2.

As has been described above, it is possible to determine the differentiation of the new data and the first data in the physical blocks 1 and 2 with respect to the logical block address LBA1 by using the program order flag POF.

However, the reading operation of reading the data, for example, at least "the number of pages on which data are written plus once" or "the number of pages on which data are not written plus once" times as described above is required in order to determine to which page the data are stored.

Then, in the fourth embodiment, it is determined to which page the data are written by using the batch read function. That is, the host system 9 issues a batch read command and reads en bloc the data in the physical block 2 and the data in the physical block 1 in the same manner as in the above embodiments. The host system 9 fetches the logical product data and determines the data of the flag data FLG. As a consequence, it is determined that the physical block 2 is the programmed block because the flag data FLG is all "1" whereas it is determined that the physical block 1 is the programming block in which the data are written up to page 1 because the flag data FLG is "001 1".

Like the programming block, it is necessary to know to which page the data are written in the reading and writing of the data with respect to a new physical block.

According to the fourth embodiment, the writing state of the physical block is detected by using the batch read function. In a block including the incomplete data, it is possible to easily detect as to up to which page in the block the data are stored. Consequently, in a control method which allows the presence of one logical block in a plurality of physical blocks, it is possible to improve the performance at the time of merging and reading the new data and the old data. Furthermore, since a page address to be written can be easily obtained at the time of writing the data, it is possible to make an attempt of largely improving the performance.

Fifth Embodiment

Next, there will be explained a fifth embodiment. In the fifth embodiment, there is shown an example in which a plurality of logical blocks are stored in one physical block, and two or more physical blocks for storing the same logical block are present.

Generally, along with an enlargement of the capacity of the NAND type flash memory and a cost reduction thereof, the enlargement of the size of the block which is an erase unit is regarded as an indispensable condition. On the other hand, there is a demand of maintaining the size of the logical block which is a management unit of the logical address to the same size as the conventional size. For this reason, data management is sometimes required wherein a plurality of logical blocks are stored in the same physical block. In the case where the data management is performed, there is considered a method of controlling data by providing a condition that a plurality of logical blocks stored in the same physical block are always stored in an order from a smaller number of the logical block.

FIG. 14 shows one example of the above-described data management. In a logical block to be stored in a physical block n, the logical block addresses LBA0, LBA1, LBA2 and LBA3 are stored in an order from a smaller number. In this case, for example, when the update of the data is generated in the logical block address LBA3, the data of the logical block addresses LBA0 to LBA2 are copied to a new block. Next, it is necessary to store the updated data of the logical block address LBA3 in the new block. This means that a large overhead is present.

Figure 15:
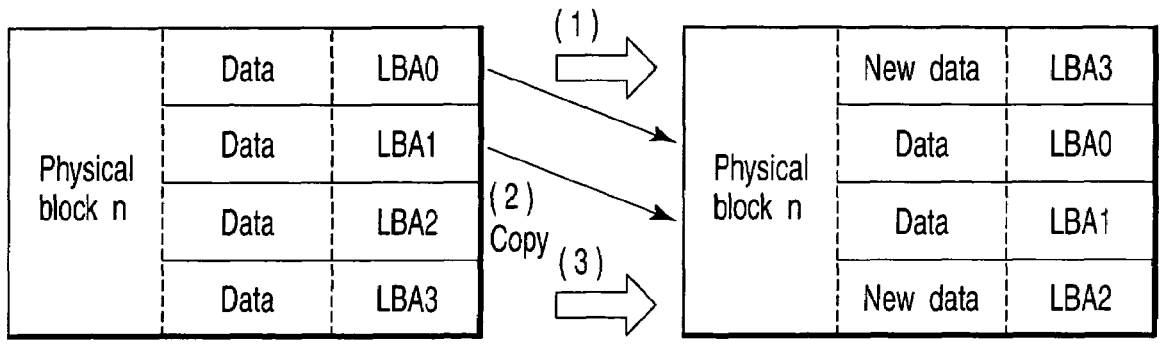
FIG. 15 is a view showing another example of data management of FIG. 14.

Then, there is also considered a method of making a control by providing a condition that logical blocks stored in the same physical blocks are always stored in such a manner that the logical addresses thereof become sequential in order. In this case, however, in the case where the data update of the logical block address LBA2 is generated after updating the data of the logical block address LBA3 as shown in, for example, FIG. 15, it is necessary to first copy the data of the logical block address LBA0 and LBA2, and to write the updated data of the logical block address LBA2. Consequently, in this case as well, the writing of the data assumes an order of (1)→(2)→(3), and the overhead does not become small.

Then, there is considered a method of limiting the range of addresses with respect to the logical block addresses stored in the same physical block, and managing data under the condition that the logical block addresses may be arranged at random. In this case, it is necessary to know which logical address is already stored in the physical block which is to be updated. However, it is necessary to read pages in the physical block a plurality of times to know the logical address, and it takes a long time to do so.

Therefore, in the fifth embodiment, shortening the time for detecting the logical address is enabled by using the batch read function.

Figure 16:
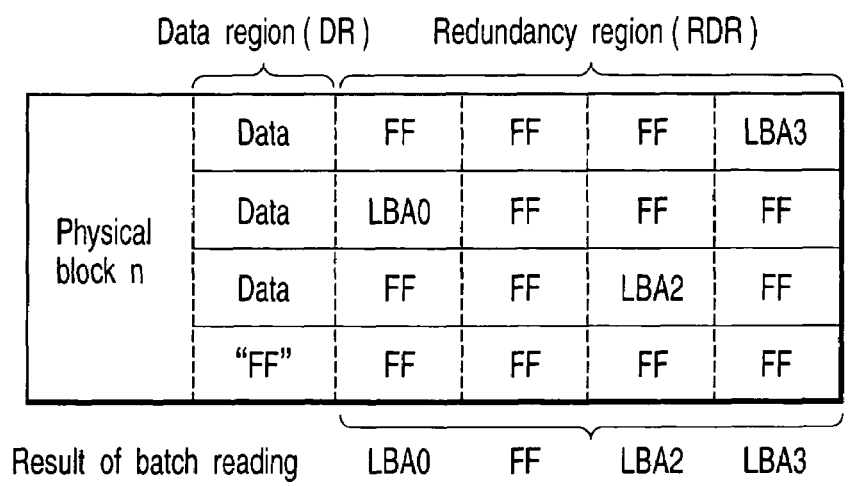
FIG. 16 is a view showing a format of a physical block which is applied to a fifth embodiment.

FIG. 16 shows a format of the physical block which is applied to the fifth embodiment. In the redundancy region RDR of the physical block, a memory region for the logical block address is provided in a matrix form in correspondence to the logical block, and the logical block address is stored in this memory region. With respect to the logical block address arranged in each row in correspondence to the logical block, only one address is stored in one column, so that a plurality of logical block addresses are not stored in one column. In a region except for the region in which the logical block address of the redundancy region is stored, "FF" is written.

In the above configuration, when the host system 9 issues a batch read command, the flash memory reads en bloc the data in the physical block in correspondence to this command. On each of the bit lines, logical product data of the data stored in the NAND strings is read. The read data is transferred to the host system 9. The host system 9 determines the logical block address of the redundancy region RDR out of the supplied data. The result of batch reading in the case of the example shown in FIG. 16 becomes "LB0", "FF", "LBA2" and "LBA3". Consequently, it is possible to know which logical address is already stored in the physical block.

According to the fifth embodiment, it is possible to read en bloc a plurality of logical block addresses stored in the redundancy region of the physical block and determine the plurality of physical block addresses. As a consequence, in the case where the logical block addresses are arranged at random in the physical block, it is possible to easily determine which logical address is stored in the physical block which is to be updated.. Consequently, it is possible to prevent the deterioration of performance.

Sixth Embodiment

In order to verify that erase is securely performed after conventional block erase, data is read and verified for each page. As a consequence, it takes a considerable time for verification after erase. In contrast, in a sixth embodiment, the verification time after erase is shortened by reading en bloc data in all the blocks after block erase.

That is, in the case where the data in the block are erased, data in each memory cell becomes "1". Thereafter, for example, a batch verification command is input. Then, the data in all the pages of the block are read en bloc as the logical product in the column direction. As a consequence, as shown in FIG. 19A, it can be seen that all the memory cells are erased in the case where the data read as the logical product in the column direction are all "1". In contrast, as shown in FIG. 19B, in the case where even one memory cell is not "1", the data read as the logical product in the column direction are not all "1". Therefore, it can be seen that the cells are not sufficiently erased. In this case, the cells are set to a normal erase state by re-erase or error-correction. Alternatively, in the case where the number of cells which are not sufficiently erased is not more than the allowable number, the cells are regarded as being sufficiently erased, so that it is determined that the data can be written.

According to the above sixth embodiment, the data in all the memory cells are read as a logical product in the column direction after the erase of the block, and the erase verification is performed by verifying the read data. Accordingly, since the erase state of the block can be determined by means of one time reading operation, the erase verification can be heightened in speed as compared with the conventional state.

Figure 17:
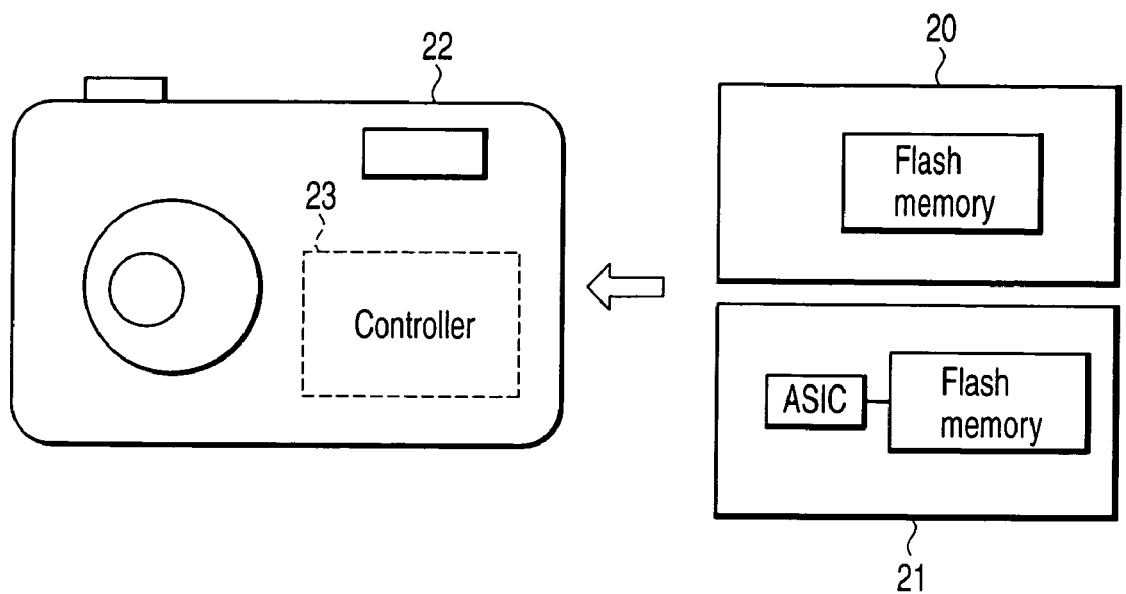
FIG. 17 is a view showing an example of an application to which each embodiment is applied.
Figure 18:
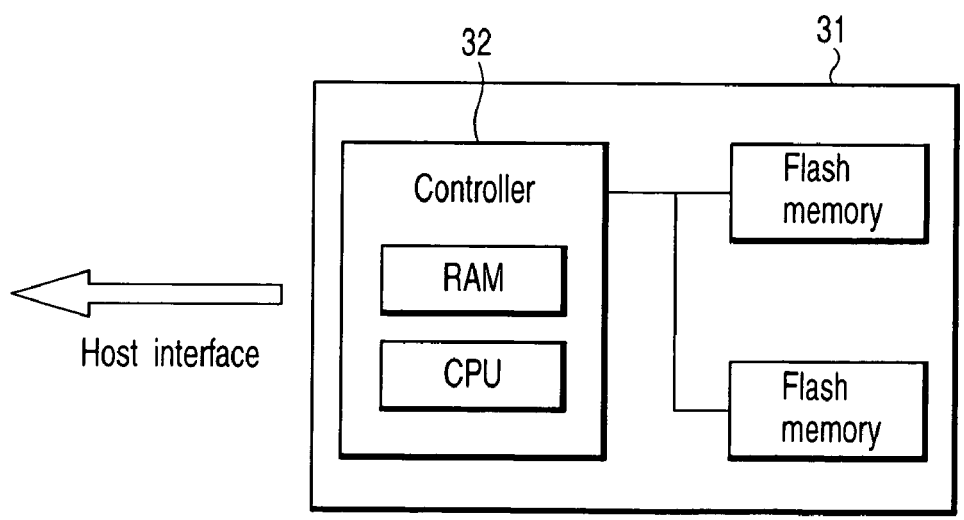
FIG. 18 is a view showing another application example to which each embodiment is applied.

FIGS. 17 and 18 show an example of an application in which the above embodiments are applied. FIG. 17 shows a memory card 20 which is not attached with a controller (generally, a microprocessor), namely which is attached with only a flash memory, and a memory card 21 which is attached with a relatively small size logic circuit or the like. The memory cards 20 and 21 are connected to, for example, a digital still camera 22. The digital still camera 22 has a controller 23 as a host system. In accordance with a command and an address signal output from the controller 23, the flash memories 20 and 21 perform the operation of each of the above embodiments or an operation obtained by arbitrarily combining the embodiments. A device on the host side is not limited to a digital still camera, and various devices such as mobile phones, readers/writers of memory cards or the like can be applied thereto.

FIG. 18 shows a case in which each of the embodiments is applied to a memory card 31 containing a controller. In the case of this example, an ATA interface, a PC card interface, a USB or the like can be considered as a host interface. It is possible to apply each of the embodiments in the case where the interface is of any such type. Furthermore, in the case of the example shown in FIG. 18, the controller 32 in the memory card 31 functions as the host system 9, and the operation of each of the embodiments or an operation of an arbitrary combination of respective embodiments is performed.

Incidentally, in each of the embodiments, there has been explained a NAND type flash memory by citing as an example a binary value memory for storing 1-bit information in one memory cell. However, the NAND type flash memory may be a multiple value memory storing one or more bit information (for example, 2-bit information) in one memory cell.

Furthermore, as shown in FIG. 8, it is not required to manage the block as to whether the block is normal or defective for each page. As shown in, for example, FIG. 14, in the case where a plurality of logical blocks are stored in one physical block, it is possible to perform management as to whether the block is normal or defective for each of the logical blocks. In this case, in the same manner as FIG. 8, it is possible to specify a defective block depending on the bit position of the data "0" detected at the time of batch reading by providing the same bit number as that of the physical block in the retardancy region, and writing flag data "0" showing a defective block to the bit position corresponding to the block in the retardancy region.

In addition, each of the embodiments has been explained by citing as an example a NAND type flash memory. However, the embodiment is not limited thereto. The embodiment can be applied to various types of flash memories such as a NOR type, an AND type, and a DINOR type.

Moreover, each of the embodiments is not limited to a flash memory comprising an EEPROM. For example, the embodiment can be applied to a magnetic random access memory (MRAM), a ferroelectric random access memory (FeRAM), an Ovonics unified memory (OUM) using a chalcogen compound or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a block having a plurality of memory cells arranged in rows and columns thereof, and including a plurality of pages, said plurality of pages are respectively arranged in rows; and
   a reading portion which reads data in said plurality of pages in the block as a logical product in each column direction,
   wherein the block has a flag in each of the pages, and the flag is set to a different column for each page.

2. The device according to claim 1, wherein
   the block has a flag in each of the pages, and
   the reading portion reads the flag in each of the pages as a logical product in the column direction when detecting a defective block.

3. The device according to claim 1, wherein
   the reading portion reads the flag in each of the pages as a logical product in the column direction when detecting a defective page in the block.

4. The device according to claim 1, wherein
   the reading portion reads a flag in each of the pages as a logical product in the column direction when detecting a writing state of the page in the block.

5. The device according to claim 1, wherein
   the flag is configured by a plurality of bits, and a value of the flag is determined by a majority.

6. The device according to claim 1, wherein
   the block has a plurality of logical blocks, each of the logical blocks having a logical block address, and each of the logical block addresses being arranged on a different column for each logical block, and
   the reading portion reads the logical block address as a logical product in the column direction when detecting the logical block address.

7. The device according to claim 1, where
   the reading portion reads all the data in the block as a logical product in the column direction after erasing the data in the block.

8. A memory card including a semiconductor device according to claim 1.

9. The memory card according to claim 8, wherein the memory card further includes a controller.

10. A host system which is attached with the memory card according to claim 9.

11. A semiconductor memory device comprising:
    a block in which a plurality of first memory cells which store data and a plurality of second memory cells which store control data are arranged in rows and columns, the block having a plurality of word lines arranged in rows thereof and a plurality of bit lines arranged in the columns thereof;
    a first reading portion which reads data at least to one of said plurality of bit lines by selecting one of said plurality of word lines; and
    a second reading portion which reads a logical product of the data in said plurality of second memory cells which share each of the bit lines via each of the bit lines by simultaneously selecting said plurality of word lines at the time of determining a state of the block,
    wherein the second reading portion is operated with a command which is different from that of the first reading portion.

12. The device according to claim 11, wherein
    said plurality of second memory cells store identification data showing as to whether or not a defect of the block is present.

13. The device according to claim 11, wherein
    said plurality of first and second memory cells connected respectively to said plurality of word lines constitute a page, and
    said plurality of second memory cells store flag data showing that the page has been written, the flag data in the pages being stored in the second memory cells in different columns.

14. A memory card including the semiconductor memory device according to claim 11.

15. The memory card according to claim 14, wherein the memory card further includes a controller.

16. A host system which is attached with the memory card according to claim 15.

* * * * *